United States Patent [19]

Mitra

[11] Patent Number: 6,157,237
[45] Date of Patent: *Dec. 5, 2000

[54] REDUCED SKEW CONTROL BLOCK CLOCK DISTRIBUTION NETWORK

[75] Inventor: Sundari S. Mitra, Milipitas, Calif.

[73] Assignee: Sun Microsystems, Inc., Palo Alto, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/641,509

[22] Filed: May 1, 1996

[51] Int. Cl.[7] ..................................................... H03K 5/15
[52] U.S. Cl. ........................................... 327/295; 327/141
[58] Field of Search ..................................... 327/292, 293, 327/295–297, 299, 144, 141; 326/93

[56] References Cited

U.S. PATENT DOCUMENTS

| | | | |
|---|---|---|---|
| 4,812,684 | 3/1989 | Yamagiwa et al. | 327/297 |
| 4,839,604 | 6/1989 | Tanahashi | 327/295 |
| 5,164,619 | 11/1992 | Luebs | 327/292 |
| 5,172,330 | 12/1992 | Watanabe et al. | 327/295 |
| 5,430,397 | 7/1995 | Itoh et al. | 327/295 |
| 5,519,351 | 5/1996 | Matsumoto | 327/295 |
| 5,537,498 | 7/1996 | Bausman et al. | 327/293 |
| 5,570,045 | 10/1996 | Erdal et al. | 327/293 |

OTHER PUBLICATIONS

D. A. Protopapas "Microcomputer Hardware Design" by Prentice Hall, pp. 9–10, 1988.

*Primary Examiner*—Tuan T. Lam
*Attorney, Agent, or Firm*—Gunnison, McKay & Hodgson, LLP; Forrest Gunnison

[57] ABSTRACT

A control block clock distribution network includes a logic circuit, one or more nth-level buffers, and a (n–1)th-level buffer that drives the one or more nth-level buffers. The logic circuit includes a predefined area containing substantially only clocked logic elements. The number of clocked logic elements in the predefined area is constrained to be less than or equal to a predetermined maximum number. The one or more nth-level buffers are located within the predefined area, whereas the (n–1)th-level buffer is located outside of the predefined area. Each nth-level buffer receives the clock signal outputted by the (n–1)th-level buffer and provides a clock signal to a predetermined number of the clocked logic elements within the predefined area Because the predefined area has known dimensions, the length of the clock line from the (n–1)th buffer to the nth-level buffers is known to within a range. Additionally, the number of clocked logic elements and the number of nth-level buffers are known to within a range. Thus, the range of resistive-capacitive loading to each clocked element within the predefined area is known. Accordingly, the maximum clock skew between clocked logic elements within the predefined area can be determined. The maximum clock skew of the predefined area can be adjusted to a desired value by varying one or more of the dimensions of the predefined area, the range of nth-level buffers that can be placed in the predefined area, or the range of clocked logic elements that can be driven by each nth-level buffer.

11 Claims, 3 Drawing Sheets

REDUCED SKEW CONTROL BLOCK CLOCK DISTRIBUTION NETWORK

FIELD OF THE INVENTION

The present invention is related to clock distribution networks and, more particularly, to multi-level clock distribution networks for distributing clock signals to control blocks.

BACKGROUND

Large integrated circuits generally have a multi-level clock distribution network for providing clock signals to the clocked logic elements of the circuit. These networks are typically designed to be used with automated place and route design tools. In general, these clock distribution networks use several levels of buffers to distribute the clock signals to the clocked logic elements. Some automated place and route design tools attempt to equalize the clock line lengths and capacitive loading within each level of buffering. However, in conventional clock distribution schemes, the automated place and route design tools cannot efficiently route the clock lines from the lowest level of buffers to the clocked logic elements with low clock skew. As a result, the designer typically must hand tune the routing of the clock lines to the clocked logic elements at the lowest level of buffering. This hand tuning of the clock lines is necessary to reduce undesirable clock skew between the clocked logic elements.

For example, FIG. 1 shows an exemplary clock distribution network 100 having four levels of buffering for an integrated circuit 101. The clock distribution network 100 includes a phase locked loop (PLL) 103 connected to a first-level buffer 105. The PLL 103 receives a raw clock signal from an off chip source (not shown) and outputs a clock signal synchronized with the raw clock signal. The clock signal outputted by the PLL 103 can have a frequency different from the frequency of the raw clock signal. The first-level buffer 105 drives, in this example, five second-level buffers 107A–107B. In addition, in this example, each second-level buffer 107A–107E drives five third-level buffers. For clarity, only the third-level buffers 109A–109E driven by the second-level buffer 107E are shown. The third-level buffers 109A–109E respectively drive a corresponding control blocks 111A–111E. Each control block includes a logic circuit with a relatively large number (up to several hundred) of clocked logic elements such as flip-flops and unclocked logic elements such as combinational logic. Each control block also includes fourth-level buffers connected to receive the buffered clock signals from the third-level buffers. The control block's fourth-level buffers provide dock signals to the clocked logic elements within the control block's logic circuit. In a typical conventional clock distribution network, these clocked and unclocked logic elements can be placed anywhere within the logic circuit.

FIG. 2 is an exemplary block diagram of the control block 111A. The control block 111A includes a logic circuit 201 that has both clocked and unclocked logic elements distributed throughout the logic circuit. In this conventional control block, the clocked and unclocked logic elements can be placed anywhere within the logic circuit 201. The control block 111A also includes fourth-level buffers 203–209. These fourth-level buffers 203–209 are coupled to receive the buffered clock signal from the third-level buffer 109A (FIG. 1). Because the clocked and unclocked logic elements are distributed throughout the logic circuit 201, the clock lines driven by the fourth-level buffers 203–209 are hand tuned to equalize capacitive loading. As is well known in the art of clock distribution networks, the capacitive loading driven by a buffer depends on both the length of the driven clock line as well as the capacitive loading of each of the clocked logic elements connected to the clock line. The required hand tuning of the clock lines undesirably increases the complexity, time and expense of designing the clock distribution network. In addition, the hand tuning may also increase the area of the clock distribution network in equalizing the lengths of the clock lines. More specifically, to equalize the line length, the designer may have to increase the line length of some clock lines, thereby occupying more area of the integrated circuit and dissipating more power due to the larger capacitance of the longer clock lines.

In addition, because the capacitive loading driven by the fourth-level buffers may be unequal, the designer may have to customize the design of the fourth-level buffer. As a result, the sizes of fourth-level buffers 203–209 may be non-standardized. Of course, the customization of the fourth-level buffers increases the time needed to design the clock distribution network. In addition, the nonstandardized sizes of the fourth-level buffers, combined with the hand tuned clock line lengths, can cause the clock skew between clock lines to be relatively high. Thus, in this conventional clock distribution network, the hand tuning and customization not only increases the cost, complexity and time of designing the circuit, but also often results in relatively large clock skews. As a result, the designer may be required to go through several iterations of designing the clock distribution network to achieve an acceptable clock skew.

SUMMARY

According to the present invention, a control block clock distribution network includes a logic circuit, one or more nth-level buffers, and a (n−1)th-level buffer that drives the one or more nth-level buffers. The logic circuit includes a predefined area containing substantially only clocked logic elements. The number of clocked logic elements in the predefined area is constrained to be less than or equal to a predetermined maximum number. The one or more nth-level buffers are located within the predefined area, whereas the (n−1)th-level buffer is located outside of the predefined area. Each nth-level buffer receives the clock signal outputted by the (n−1)th-level buffer and provides a clock signal to a predetermined number of the clocked logic elements within the predefined area of the logic circuit.

Because the predefined area has known dimensions, the length of the dock line from the (n−1)th buffer to the nth-level buffers is known to within a range. In addition, the number of clocked logic elements and the number of nth-level buffers are also known to within a range. As a result, the range of resistive-capacitive loading to each docked element within the predefined area is known. Accordingly, the maximum clock skew between clocked logic elements within the predefined area can be determined. The maximum clock skew of the predefined area can then be adjusted to substantially any arbitrary value by varying one or more of either the dimensions of the predefined area, the range of nth-level buffers that can be placed in the predefined area, or the range of clocked logic elements that can be driven by each nth-level buffer. Moreover, this network is easily implemented with an automated place and route tool, thereby substantially eliminating the need for hand tuning of clock lines. Still further, because this network does not require that the clock line lengths be equalized within the predefined area, no area is wasted in equalizing line lengths and, thus, the total length of the clock lines within the logic circuit is reduced. The reduced clock line length dissipates less power and frees area for other uses.

In one embodiment, the nth-level buffers are fifth-level buffers and the predefined area is rectangular. The rectangular area contains a single row of flip-flops and fifth-level buffers. Each fifth-level buffer is constrained by the design rules to drive either a single flip-flop, two flip-flops, four flip-flops or eight flip-flops. Consequently, the number of fifth-level buffers within the predefined area depends on the number and grouping of the flip-flops. Thus, for example, if the predefined area contains seven flip-flops, three fifth-level buffers may be used. In this case, one fifth-level buffer could be connected to four flip-flops, a second fifth-level buffer can be connected to two flip-flops, and a third fifth-level buffer can be connected to a single flip-flop.

In another embodiment, the logic circuit contains a plurality of predefined areas each containing substantially only clocked logic elements. Each predefined area is coupled to a corresponding (n−1)th-level buffer, where each (n−1)th-level buffer is connected to receive a clock signal from a single (n−2)th-level buffer corresponding to the control block. Each (n−1)th-level buffer is connected to one or more nth-level buffers located within each (n−1)th-level buffer's corresponding predefined area, as described above.

In still another embodiment, the (n−1)th-level buffers are selected from a standard cell library according to the number of nth-level buffers used in the predefined and the clock line length needed to connect these nth-level buffers to the (n−1)th-level buffer. This scheme can also be easily implemented in an automated place and route tool. For relatively large capacitive loads (i.e., caused by a large number of nth-level buffers and/or long clock line length) a large (n−1)th-level buffer is used to compensate for the longer rise and fall times caused by the relatively large load. In contrast, for a predefined area containing only a few clocked logic elements, a relatively small (n−1)th-level buffer can be used. As a result, the rise and fall times of the clock signals are more closely equalized, thereby further reducing the clock skew.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

Figure 3:
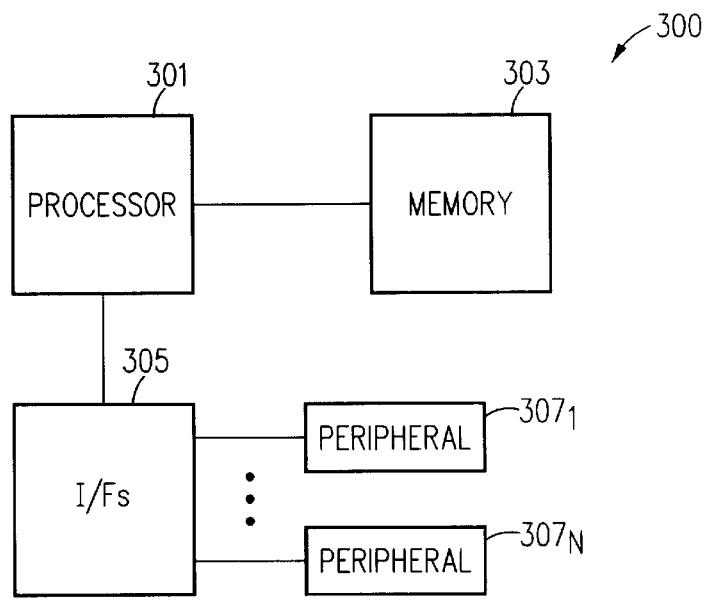
FIG. 3 is a block diagram of an electronic system having an integrated circuit implementing a control block clock distribution network according to one embodiment of the present invention.

FIG. 3 is a block diagram of an electronic system 300 having an integrated circuit 301 implementing a control block clock distribution network (described below in conjunction with FIGS. 4–5) according to one embodiment of the present invention. As used herein, a control block refers to block of circuitry having both clocked and unclocked logic elements for performing logic operations on received digital signals. The electronic system 300 can be any type of computer or electronic system. In this embodiment, the electronic system 300 is a computer system where the integrated circuit 301 is a processor connected to a memory 303 and to interfaces 305 to interact with peripherals $307_1$–$307_N$. The processor can be any type of processor such as, for example, "X86"-type, Sparc®, Alpha®, MIPS®, HP®, Pentium® and PowerPC® processors. The memory 303 and the interfaces 305 can be any type of memory or interface for use in computer systems. Likewise, the peripherals can be any type of peripheral such as, for example, displays, mass storage devices, keyboards or any other type of input or input-output device.

Figure 1:
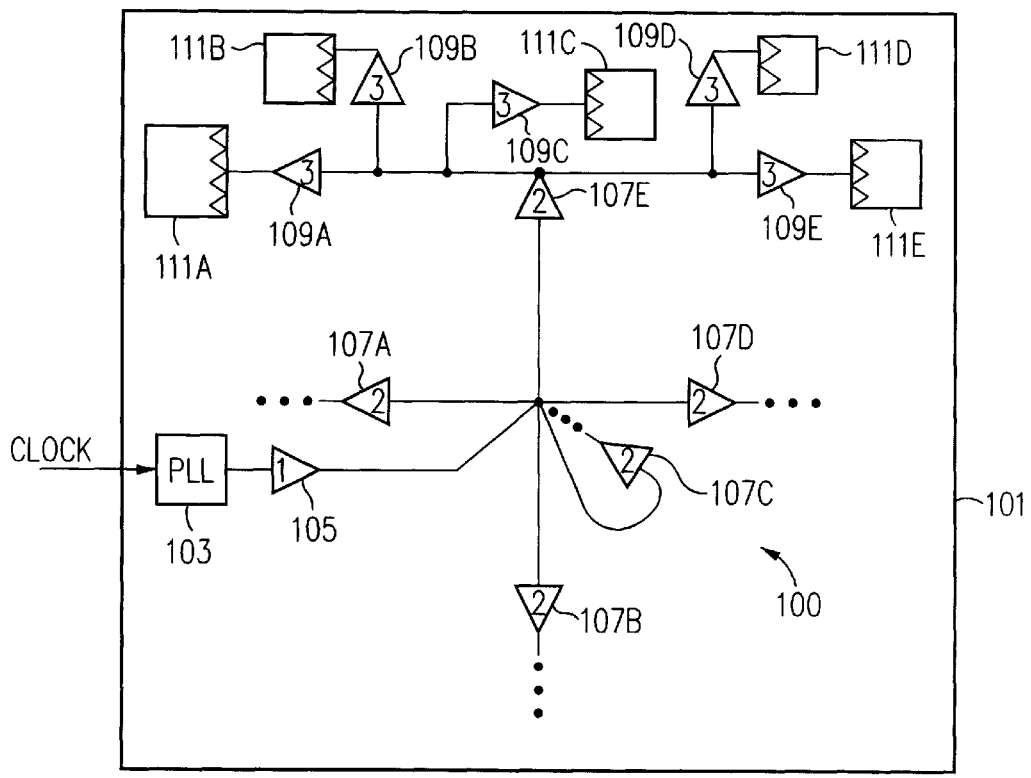
FIG. 1 is a block diagram of a conventional four level clock distribution network for an integrated circuit.
Figure 4:
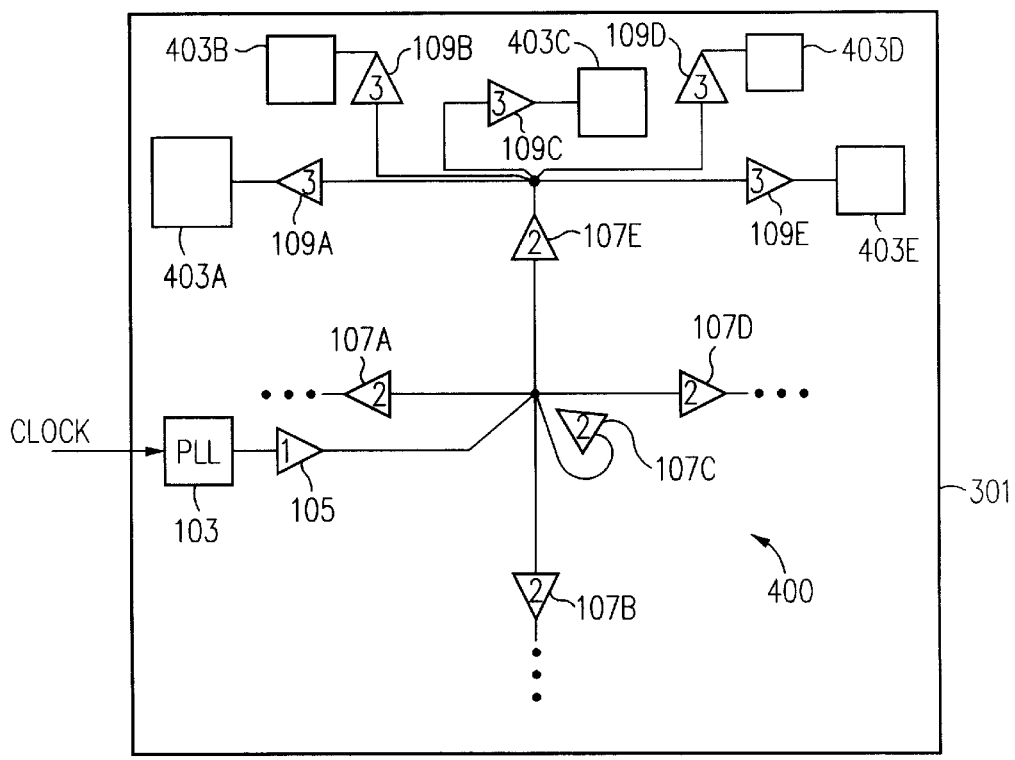
FIG. 4 is a block diagram of an integrated circuit having a five level clock distribution network according to one embodiment of the present invention.

FIG. 4 is a block diagram of a five level clock distribution network 400 implemented in the processor 301 of the computer system 300 (FIG. 3), according to one embodiment of the present invention. The clock distribution network 400 is similar to the clock distribution network 100 (FIG. 1), except that the clock distribution network 400 has control blocks 403A–403E (described below in conjunction with FIG. 5) instead of control blocks 111A–11E. Also, each second-level buffer is connected to its corresponding third-level buffers in a point-to-point manner. Accordingly, as described above in conjunction with FIG. 1, the clock distribution network 400 includes the PLL 103 that drives the first-level buffer 105, which in turn drives the five second-level buffers 107A–107E. Each of the five second-level buffers 107A–107E drives five third-level buffers. For clarity, only the five third-level buffers 109A–109E driven by the second-level buffer 107E are shown in FIG. 4. The five third-level buffers 109A–109E are coupled to control blocks 403A–403E, respectively. The control blocks 403A–403E each include fourth-level and fifth-level buffers as described below in conjunction with FIG. 5.

In addition, the clock distribution network 400 can be used in conjunction with other clock distribution systems on the same integrated circuit 301 to distribute clock signals to other types of blocks. For example, the clock distribution network 400 can be used with the clock distribution network disclosed in co-filed and commonly assigned U.S. patent application Ser. No. 08/640,721 entitled "Clock Distribution Network With Modular Buffers" by S. Mitra, which is incorporated herein by reference.

Although a five level clock distribution network for a processor is described, in other embodiments the clock distribution network can be implemented in other types of integrated circuits. The present invention is advantageously used in any integrated circuit with control blocks. Further, the number of levels in the clock distribution network can be adapted to the requirements of the integrated circuit and need not have five levels.

Figure 5:
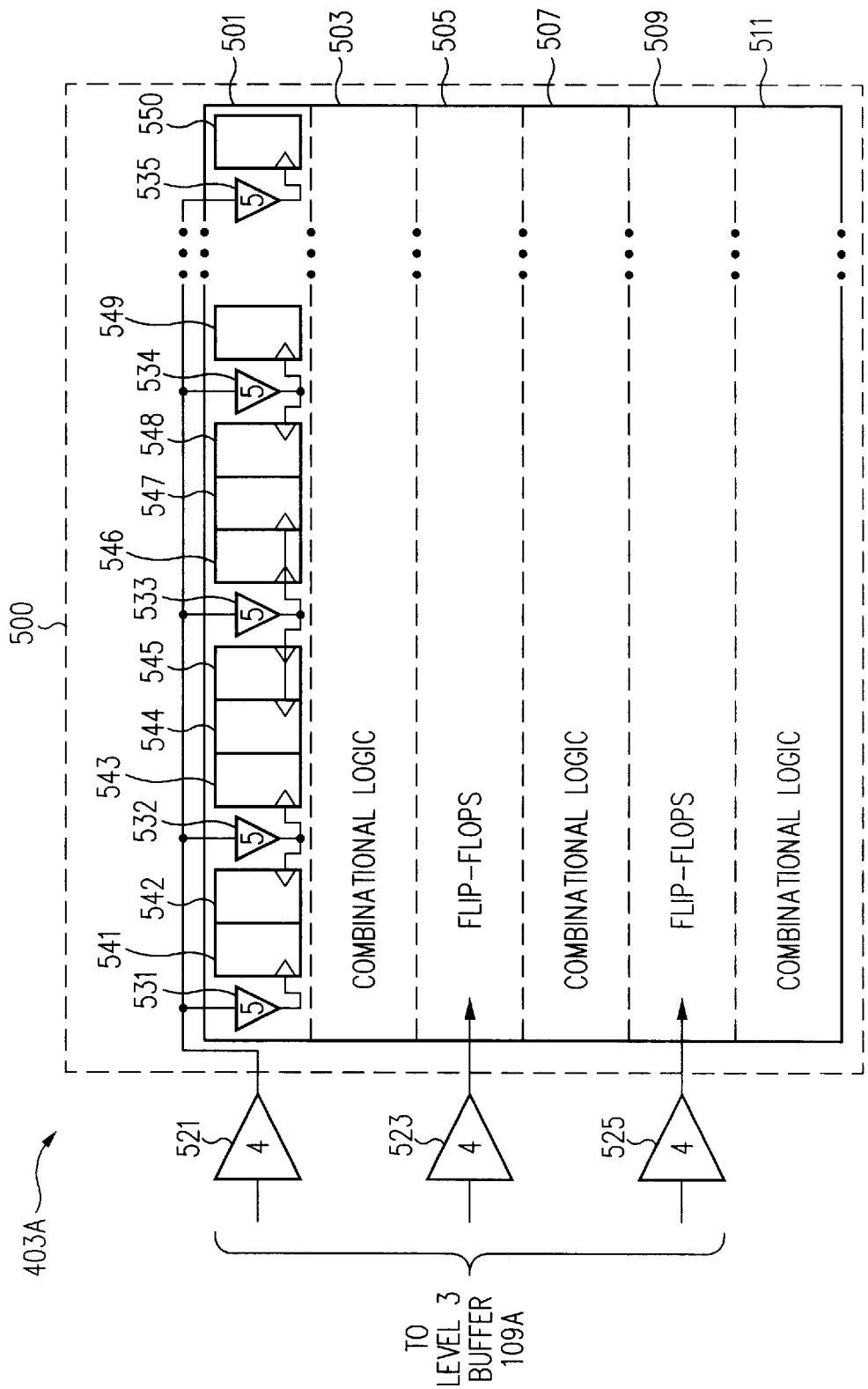
FIG. 5 is a block diagram of a control block according to one embodiment of the present invention.

FIG. 5 is a block diagram of one embodiment of the control block 403A of the clock distribution network 400 (FIG. 4), according to the present invention. The control block 403A includes a logic circuit 500 having predefined areas 501–511. In this embodiment, the predefined areas 501, 505 and 509 include substantially only clocked logic elements, whereas the predefined areas 503, 507 and 511 include substantially only unclocked logic elements. The unclocked logic elements in the predefined areas 503, 507 and 511 can be any suitable type of combinational logic circuitry appropriate for the logic function of the control block and are omitted for clarity. The control block 403A also includes fourth-level buffers 521–525 that are connected to receive a clock signal from the third-level buffer 109A FIG. 4). The fourth-level buffers 521, 523 and 525 are respectively connected to predefined areas 501, 505 and 509. The control blocks 403B–403E (FIG. 4) are substantially similar to the control block 403A, but each control block may include a different number or combination of predefined areas, logic elements and buffers as appropriate for the control block's functions.

In this embodiment, each predefined area of clocked logic elements is rectangular in shape and includes one or more of flip-flops and fifth-level buffers. The flip-flops and fifth-level buffers are arranged in a row within the rectangular area. Of course, in other embodiments, the predefined area can be in any suitable predefined shape, and the clocked logic elements can be laid out in any suitable predefined arrangement. For clarity, only the flip-flops and the fifth-level buffers of the predefined area 501 are shown in the predefined area 501. In addition, while only the clock line interconnections are shown, it is understood that the control, input and output leads of the flip-flops are interconnected with other flip-flops and the combinational logic in the logic circuit 500. The flip-flops can be any suitable flip-flop such as, for example, the flip-flop disclosed in co-filed and commonly assigned U.S. patent application Ser. No. 08/640,562, entitled "Flip-Flop with Full Scan Capability" by S. Mitra, which is incorporated herein by reference.

Figure 2:
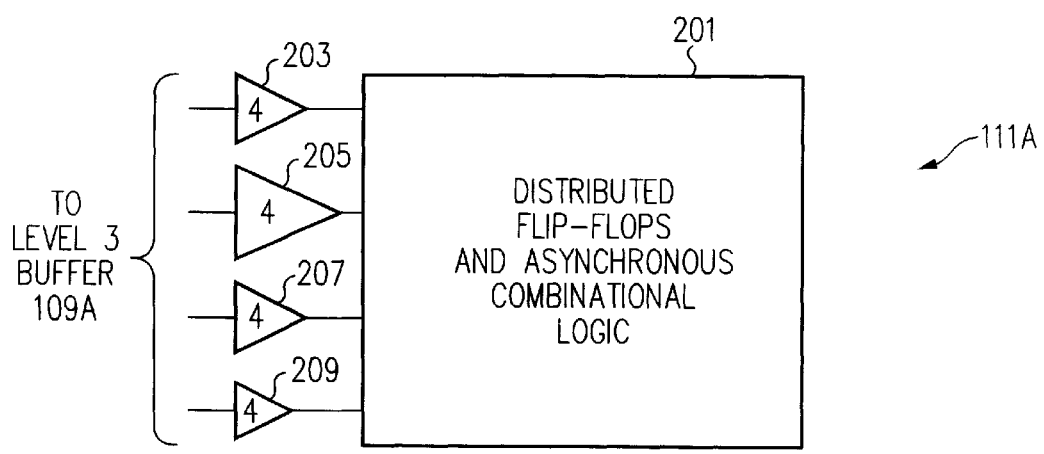
FIG. 2 is a block diagram of a control block of the integrated circuit depicted in FIG. 1.

In this exemplary embodiment, the fourth-level buffer 521 is connected to the input leads of fifth-level buffers 531-535. The number of fifth-level buffers in a predefined area depends on the number and grouping of the clocked logic elements contained in the predefined area. The fifth-level buffers can be any suitable buffer such as, for example, the buffer disclosed in co-filed and commonly assigned U.S. patent application Ser. No. [Attorney Docket No. SUNM19275] entitled "Final Stage Clock Buffer in a Clock Distribution Network" by S. Mitra, which is incorporated herein by reference. The buffer disclosed in the aforementioned Serial No. 08/640,660 has a low input capacitance, thereby reducing the capacitive load driven by the fourth-level buffer 521. Thus, the fourth-level buffer 521 typically can be smaller (and, thus, dissipating less power) than any of the fourth-level buffers 203–209 (FIG. 2). Of course, smaller size and lower power dissipation are very desirable attributes in many applications.

In accordance with the present invention, each fifth-level buffer is constrained to drive a predetermined number of clocked logic elements, the predetermined number being selected from a set of allowed numbers of clocked logic elements. For example, in this embodiment, the design rules for an automated design tool for placing and routing the clock lines allows a fifth level buffer to drive only a single flip-flop or two flip-flops or four flip-flops. Of course, in other embodiments, the set of predetermined numbers of clocked logic elements that a fifth level buffer is allowed drive can be varied as appropriate for the application and the desired skew tolerance. Thus, as shown in FIG. 5, the fifth-level buffer 531 drives a single flip-flop 541, the fifth-level buffer 532 drives two flip-flops 542 and 543, and the fifth-level buffer 533 drives four flip-flops 544–547 (and so on). In one embodiment, a fourth level buffer can drive up to eighteen fifth level buffers contained in a predefined area of approximately three mils in length, which drive up to fifty-four flip-flops. Because the length of the shortest and longest clock line and the minimum and maximum capacitive load are substantially predetermined, the maximum clock skew can be determined. Thus, for example, the worst case clock skew for a predefined area is determined in part by, (1) the clock line length to the first fifth-level buffer in the row driving a single flip-flop; and (2) the clock line length to the last fifth-level buffer driving four flip-flops.

The predefined areas 505 and 509 are substantially similar to the predefined area 501, except that the predefined area 505 and 509 may include different combinations and numbers of fifth-level buffers and flip-flops. By suitably predefining the size and shape of the predefined areas, the numbers of flip-flops that can driven by a fifth-level buffer, and the numbers of fifth-level buffers that can be driven by a fourth-level buffer, the maximum clock skew of the logic circuit 500 can set to substantially any suitable value. Because of the standardization utilized in the present invention, control block clock skew is efficiently reduced without undesirable hand tuning of clock lines or customization of buffers. In addition, the standardization achieves the reduced clock skew without using additional area for clock line equalization within the control block, thereby saving area and reducing power dissipation.

In another embodiment, the fourth-level buffers 521–525 are sized according to the clock line length and number of fifth-level buffers driven by the fourth-level buffer. In this embodiment, the fourth-level buffers are selected from a group of predefined fourth-level buffers in a standard cell library of an automated design tool.

An appropriately sized fourth-level buffer is selected to drive the load caused by the capacitance of the clock line and the input capacitance of the fifth level buffers, which helps to equalize the rise and fall times of the clock signals. Thus, by appropriately sizing the fourth-level buffer, the clock skew for the logic circuit can be reduced further. For one embodiment, Table 1 below summarizes in matrix form the selection of the buffer size according to the clock line length and number of fifth-level buffers to be driven by the fourth-level buffer.

TABLE 1

| | Range of Clock Line Length ($\mu$m) | | | | | | | | | | | | | | |
|---|---|---|---|---|---|---|---|---|---|---|---|---|---|---|---|
| No of Headers | 180–300 | 300–350 | 350–425 | 425–565 | 565–719 | 719–849 | 849–900 | 900–1200 | 1200–1500 | 1500–1900 | 1900–2200 | 2200–2400 | 2400–2700 | 2700–2900 | 2900–3100 |
| 1 | 3X | 4X | 4X | — | — | — | — | — | — | — | — | — | — | — | — |
| 2 | 3X | 4X | 5X | 5X | 6X | 6X | 7X | 8X | — | — | — | — | — | — | — |
| 3 | 3X | 4X | 5X | 6X | 6X | 7X | 7X | 9X | 10X | — | — | — | — | — | — |
| 4 | — | 4X | 5X | 6X | 6X | 7X | 7X | 9X | 10X | 12X | — | — | — | — | — |
| 5 | — | — | 5X | 6X | 7X | 8X | 8X | 9X | 12X | 12X | 16X | 16X | 17X | — | — |
| 6 | — | — | — | 6X | 7X | 8X | 8X | 9X | 12X | 14X | 17X | 17X | 19X | — | — |
| 7 | — | — | — | 7X | 8X | 8x | 9X | 10X | 12X | 14X | 17X | 19X | 20X | 21X | — |
| 8 | — | — | — | — | 8X | 8X | 9X | 10X | 12X | 14X | 19X | 19X | 20X | 22X | — |
| 9 | — | — | — | — | — | 9X | 10X | 12X | 14X | 16X | 19X | 19X | 21X | 22X | 25X |
| 10 | — | — | — | — | — | 9X | 10X | 12X | 14X | 17X | 19X | 19X | 21X | 22X | 25X |

TABLE 1-continued

| | Range of Clock Line Length (μm) | | | | | | | | | | | | | | |
|---|---|---|---|---|---|---|---|---|---|---|---|---|---|---|---|
| No of Headers | 180–300 | 300–350 | 350–425 | 425–565 | 565–719 | 719–849 | 849–900 | 900–1200 | 1200–1500 | 1500–1900 | 1900–2200 | 2200–2400 | 2400–2700 | 2700–2900 | 2900–3100 |
| 11 | — | — | — | — | — | — | 10X | 12X | 14X | 17X | 19X | 20X | 21X | 25X | 25X |
| 12 | — | — | — | — | — | — | 10X | 12X | 14X | 17X | 20X | 20X | 22X | 25X | 27X |
| 13 | — | — | — | — | — | — | — | 14X | 16X | 19X | 20X | 20X | 22X | 25X | 27X |
| 14 | — | — | — | — | — | — | — | — | 16X | 19X | 20X | 21X | 23X | 25X | 27X |
| 15 | — | — | — | — | — | — | — | — | 17X | 19X | 20X | 21X | 23X | 27X | — |
| 16 | — | — | — | — | — | — | — | — | — | 19X | 20X | 21X | 23X | 27X | — |
| 17 | — | — | — | — | — | — | — | — | — | — | — | — | 23X | 27X | — |

Thus, for example, a fourth-level buffer driving six fifth-level buffers and a clock line length of 600 μm would be sized seven times the size of the minimum geometry buffer for the process used in this embodiment. The dashed lines in Table 1 indicate non-occurring illegal configurations.

The embodiments of the control block clock distribution network described above are illustrative of the principles of this invention and are not intended to limit the invention to the particular embodiments described. For example, the clocked logic elements can be any type of clocked logic element in addition to flip-flops. In other embodiments, the penultimate level of buffers (e.g., the fourth-level buffers in a five level clock distribution network) may be located near the center of the predefined area instead of at one end. In still another embodiment, the penultimate level of buffers may be coupled to more than one predefined area of clocked logic elements. Accordingly, while a preferred embodiment of the invention has been illustrated and described, it will be appreciated that in view of this disclosure, various changes can be made therein without departing from the spirit and scope of the invention.

What is claimed is:

1. A clock distribution network having n levels, n being an integer greater than 1, the clock distribution network comprising:
   a logic circuit having:
      a plurality of first predefined areas, each of said first predefined areas containing substantially only clocked logic elements; and
      a second predefined area containing substantially only unclocked logic elements; and
   a (n–1)th-level buffer disposed outside of said logic circuit and coupled to one of said first predefined areas in said plurality of first predefined areas,
      wherein said (n–1)th-level buffer is configured to output a clock signal;
      said one of said first predefined areas contains a plurality of nth-level buffers, each nth-level buffer of said plurality of nth-level buffers being coupled to receive said clock signal outputted by said (n–1)th-level buffer;
      each said nth-level buffer of said plurality of nth-level buffers is further configured to distribute said clock signal from said (n–1)th-level buffer to a predetermined number of said clocked logic elements in said one of said first predefined areas, said predetermined number of said clocked logic elements being selected from a finite set of allowed numbers of clocked logic elements wherein said finite set includes a plurality of said allowed numbers of clocked logic elements; and
   another (n–1)th level buffer wherein said (n–1)th-level buffer and said another (n–1)th level buffer are a plurality of (n–1)th-level buffers; and said another (n–1)th-level buffer is coupled to another plurality of said nth level buffers, said another plurality of said nth level buffers being contained in another first predefined area of said plurality of first predefined areas.

2. The clock distribution network of claim 1 wherein said (n–1)th-level buffer and said another (n–1)th-level buffer are coupled to each receive a single clock signal from a (n–2)th-level buffer.

3. The clock distribution network of claim 2 comprising:
   another logic circuit having:
      another plurality of said first predefined areas wherein each of said first predefined areas in said another plurality of first predefined areas includes a plurality of nth level buffers; and
      a plurality of said second predefined area;
   another plurality of said (n–1)th-level buffers
   wherein each (n–1)th-level buffer in said another plurality of said (n–1)th level buffers is coupled to a representative one of said first predefined areas in said another plurality of said first predefined areas; and
      another (n–2)th level buffer coupled to each of said (n–1)th level buffers in said another plurality of said (n–1)-level buffers wherein said (n–2)th level buffer and said another (n–2)th level buffer comprise a plurality of (n–2)th-level buffers.

4. The clock distribution network of claim 3 wherein n is greater than four, the clock distribution network further comprising a (n–3)-level buffer coupled to said plurality of (n–2)th-level buffers, and further comprising a (n–4)th-level buffer coupled to said (n–3)th-level buffer.

5. A clock distribution network having n levels, n being an integer greater than 1, the clock distribution network comprising:
   a logic circuit having a plurality of predefined areas each containing substantially only clocked logic elements, said logic circuit having another predefined area separate from said plurality of predefined areas and containing substantially only unclocked logic elements;
   a plurality of (n–1)th-level buffers disposed outside of said plurality of predefined areas of said logic circuit, each (n–1)th-level buffer of said plurality of (n–1)th-level buffers being coupled only to a corresponding predefined area containing said clocked logic elements of said logic circuit, wherein said each of said plurality of (n–1)th-level buffers is configured to output a clock signal wherein each said (n–1)th-level buffer of said plurality of (n–1)th-level buffers is implemented with a buffer selected from a finite set of predefined buffers of differing sizes; and
   a plurality of nth-level buffers, each predefined area containing said clocked logic elements of said plurality of predefined areas having at least one nth-level buffer of said plurality of nth-level buffers, each said nth-level buffer of said plurality of nth-level buffers being coupled to receive said clock signal outputted by said corresponding (n−1)th-level buffer, wherein said at least one nth-level buffer is configured to distribute said clock signal from said corresponding (n−1)th-level buffer to said clocked logic elements within said corresponding predefined area containing said clocked logic elements of said logic circuit.

6. The clock distribution network of claim 5 wherein said implementation of a particular (n−1)th-level buffer of said plurality of (n−1)th-level buffers depends on a number of nth-level buffers coupled to said particular (n−1)th-level buffer.

7. The clock distribution network of claim 5 wherein said implementation of a particular (n−1)th-level buffer of said plurality of (n−1)th-level buffers depends on a clock line length driven by said particular (n−1)th-level buffer.

8. A computer system comprising:
   a memory;
   an interface configured to interact with a peripheral device; and
   a circuit coupled to said memory and said interface, said circuit comprising:
   a logic circuit including:
      a plurality of first predefined areas, each said first predefined areas containing substantially only clocked logic elements; and
      a second predefined area separate from said plurality of first predefined areas and containing substantially only unclocked logic elements;
   a (n−1)th-level buffer disposed outside of said logic circuit and coupled only to one of said first predefined areas in said plurality of first predefined areas,
      wherein said (n−1)th-level buffer is configured to output a clock signal;
      said one of said first predefined areas contains a plurality of nth-level buffers couple to receive said clock signal outputted by said (n−1)th-level buffer;
      each said nth-level buffer of said plurality of nth-level buffers is configured to distribute said clock signal to a predetermined number of clocked logic elements in said one of said first predefined areas, said predetermined number of clocked logic elements being selected from a finite set of allowed numbers of clocked logic elements wherein said allowed numbers of clocked logic elements is a plurality; and
      said clock distribution network further comprises another (n−1)th level buffer and said (n−1)th-level buffer and said another (n−1)th level buffer are a plurality of (n−1)th-level buffers; and said another (n−1)th-level buffer is coupled to another plurality of said nth level buffers, said another plurality of said nth level buffers being contained in another first predefined area of said plurality of first predefined areas.

9. The computer system of claim 8 wherein said (n−1)th-level buffer and said another (n−1)th-level buffer are coupled to each receive a single clock signal from a (n−2)th-level buffer.

10. The computer system of claim 9 further comprising:
   another logic circuit having:
      another plurality of said first predefined areas wherein each of said first predefined areas in said another plurality of first predefined areas includes a plurality of nth level buffers; and
      a plurality of said second predefined area;
      another plurality of said (n−1)th-level buffers
   wherein each (n−1)th-level buffer in said another plurality of said (n−1)th level buffers is coupled to a different one of said first predefined areas in said another plurality of said first predefined areas;
      another (n−2)th level buffer coupled to each of said (n−1)th level buffers in said another plurality of said (n−1)-level buffers wherein said (n−2)th level buffer and said another (n−2)th level buffer comprise a plurality of (n−2)th-level buffers.

11. The computer system of claim 8 wherein each said (n−1)th-level buffer of said plurality of (n−1)th-level buffers is implemented with a buffer selected from a finite set of predefined buffers of differing sizes.

* * * * *